(12) United States Patent
Johnson

(10) Patent No.: US 6,304,138 B1
(45) Date of Patent: Oct. 16, 2001

(54) AUDIO-FREQUENCY POWER AMPLIFIER THAT UTILIZES A BRIDGED AMPLIFIED CONFIGURATION

(75) Inventor: Nicky M. Johnson, Los Altos, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/527,932

(22) Filed: Mar. 17, 2000

(51) Int. Cl.$^7$ .............................. H03F 3/45; H03F 3/68
(52) U.S. Cl. ................................. 330/69; 330/84
(58) Field of Search .................... 330/69, 84, 124 R, 330/127, 148, 297

(56) References Cited

U.S. PATENT DOCUMENTS

| | | | | |
|---|---|---|---|---|
| 5,227,735 | * | 7/1993 | Lumsden | 330/84 |
| 5,424,683 | | 6/1995 | Takahashi et al. | 330/255 |
| 5,648,742 | * | 7/1997 | Ghaffaripour | 330/69 X |
| 6,104,248 | * | 8/2000 | Carver | 330/297 |
| 6,160,446 | * | 12/2000 | Azimi et al. | 330/69 |

OTHER PUBLICATIONS

SANYO, 17–W, 2–Channel BTL AF High–Efficiency Power Amplifier for Car Stereo Systems, LA4905, Aug. 1996, No. 5504–10/10.

Integrated Circuits, Data Sheet, TDA1561Q, 2X23 W High Effifiency Car Radio Power Amplifier, Aug. 14, 1997.

* cited by examiner

Primary Examiner—Steven J. Mottola
(74) Attorney, Agent, or Firm—Pillsbury Winthrop LLP

(57) ABSTRACT

An audio-frequency power bridged amplifier operates without a negative rail when responding to non-negative input signals, e.g. input signals ranging from zero to five volts. The amplifier also eliminates the problem of one differential rail being clipped before the other differential rail. When combined with a tracking circuit to form a Class H amplifier, the Class H amplifier operates with two positive rails rather than the two positive and two negative rails conventionally used with Class H amplifiers.

37 Claims, 3 Drawing Sheets

V1

V2

V1-V2

AUDIO-FREQUENCY POWER AMPLIFIER THAT UTILIZES A BRIDGED AMPLIFIED CONFIGURATION

BACKGROUND OF THE INVENTION

1. Field of the Invention

The present invention relates to audio-frequency power amplifiers and, more particularly, to an audio-frequency power amplifier that utilizes a bridged amplifier configuration.

2. Description of the Related Art

An audio-frequency power amplifier is a device that delivers power to a load, such as a speaker. Audio-frequency power amplifiers are commonly implemented in a number of ways. The efficiency by which these power amplifiers deliver power to the load, which is measured as the ratio of the power delivered to the load divided by the total power input to the amplifier, varies greatly among the different implementations.

One type of implementation, known as a Class A amplifier, is the most inefficient at delivering power to a load. Class A amplifiers have a linear region of operation, and are biased to operate from the center of the linear region of operation. When the input signal has no amplitude, a current that corresponds with the center of the linear region flows through the amplifier. When the amplitude of the input signal increases, the current increases, and when the amplitude decreases, the current decreases. As a result, a Class A amplifier consumes power throughout the entire cycle of the input signal, i.e., consumes power regardless of the amplitude of the input signal.

One example of a Class A amplifier is a power field-effect transistor (FET). A power FET has a source, a drain, a gate, and a linear region of operation. When configured as a Class A amplifier, a bias voltage is applied to the gate which, in turn, causes a current to flow through the FET which corresponds with the center of the linear region of operation.

When the input signal makes a positive excursion, the voltage on the gate is increased which causes the magnitude of the current to increase. When the input signal makes a negative excursion, the voltage on the gate is decreased which causes the magnitude of the current to decrease. Although inefficient from a power standpoint, Class A amplifiers provide a minimum amount of waveform distortion, and are thus widely used in audio systems.

Another implementation, known as a Class B amplifier, is more efficient at delivering power to a load than a Class A amplifier, but adds significantly more distortion to the output signal than a Class A amplifier. Class B amplifiers have a linear region of operation that ideally passes through the turn off point of the amplifier, and are biased to operate from the turn off point. Thus, when the input signal has no amplitude, no current flows through the amplifier. When the amplitude of the input signal increases, the current increases, and when the amplitude decreases, the current decreases.

One example of a Class B amplifier is an n-channel power FET connected in series with a p-channel power FET where the gates of the FETs form the input and the sources of the FETS form the output. When the input signal is equal to zero, both FETs are turned off. When the input signal makes a positive excursion, the n-channel FET turns on to source a current while the p-channel turns off. On the other hand, when the input signal makes a negative excursion, the p-channel FET turns on to sink a current while the n-channel turns off. Thus, since neither of the FETs in on when the input signal has no amplitude, and only one of the FETs is on when a positive or negative amplitude is present, a Class B amplifier is more efficient than a Class A amplifier.

As noted above, a Class B amplifier adds significantly more distortion to the signal than a Class A amplifier. This result occurs because power FETs do not have a linear region of operation that extends down to the turn off point. Instead, power FETs have a small non-linear region that lies between the turn off point and the linear region of operation. Thus, each time the input signal transitions by the turn off point, the signal is distorted.

Another amplifier, known as a Class A/B, is more efficient at delivering power to a load than a Class A (although less efficient than a Class B), and adds less distortion than a Class B (although more distortion than a Class A). Amplifiers that are categorized as Class A/B amplifiers utilize features taken from both Class A amplifiers and Class B amplifiers.

The above described example of a Class B amplifier can be converted into a Class A/B amplifier by applying a positive bias voltage to the gate of the n-channel FET and a negative bias voltage to the gate of the p-channel FET. The positive bias voltage is sufficient to place the n-channel FET at lower end of the linear region of operation, while the negative bias voltage is sufficient to place the p-channel FET at the upper end of the linear region of operation.

In this configuration, when the input signal has no amplitude, the n-channel sources a current which is sunk by the p-channel transistor. As the amplitude of the input signal increases, the n-channel FET linearly increases the current being sourced, while the p-channel non-linearly decreases the current being sunk, and then stops. Thus, the effect of the non-linear region of the p-channel FET is reduced by the stronger effect of the linear region of the n-channel FET.

Similarly, as the amplitude of the input signal decreases, the p-channel FET linearly increases the current being sunk, while the n-channel non-linearly decreases the current being sourced, and then stops. Thus, the effect of the non-linear region of the n-channel FET is reduced by the stronger effect of the linear region of the p-channel FET.

In this example, the Class A/B amplifier is less efficient than a Class B in that the n-channel FET is turned on during the positive excursions of the input signal and a portion of the negative excursions. In the Class B example, the n-channel FET was not turned on at all during the negative excursions of the input signal. Similarly, the p-channel FET is turned on during the negative excursions of the input signal and a portion of the positive excursions. In the Class B example, the p-channel FET was not turned on at all during the positive excursions of the input signal.

A Class A/B amplifier can also be implemented differentially as a bridged amplifier. FIG. 1 shows a schematic diagram that illustrates a conventional bridged amplifier 100. As shown in FIG. 1, amplifier 100 has a first operational amplifier (op amp) 110. First op amp 110, in turn, has a positive input connected to an input node $N_{IN}$, and a negative input connected to a first intermediate node $N_1$. In addition, op amp 110 also has an output connected to a first output node $N_{out1}$. further, op amp 110 is connected to an upper supply rail VCC, and a lower supply rail VEE.

As additionally shown in FIG. 1, amplifier 100 also has a second operational amplifier (op amp) 112. Second op amp 112 has a positive input connected to a reference voltage $V_{REF}$, and a negative input connected to a second intermediate node N2. In addition, op amp 112 also has an output connected to a second output node $N_{OUT2}$. Further, op amp 112 is connected to the upper supply rail VCC, and the lower supply rail VEE.

Amplifier 100 additionally has a pair of feedback resistors RF1 and RF2, and a pair of input resistors RIN1 and RIN2. Feedback resistor RF1 is connected between the output and the negative input of op amp 110, while feedback resistor RF2 is connected between the output and the negative input of op amp 112.

Further, input resistor RIN1 is connected between the negative input of op amp 110 and the reference voltage $V_{REF}$, while input resistor RIN2 is connected between the negative input of op amp 112 and the input node $N_{IN}$. An input signal $V_{IN}$ can be directly applied to input node $N_{IN}$ if a common reference exists between the input voltage $V_{IN}$ and the reference voltage $V_{REF}$, or can be applied via a capacitor C as shown in FIG. 1.

In operation, op amp 110 and resistors RF1 and RIN1 are connected together to form a non-inverting negative feedback circuit that outputs a first voltage V1 as described by equation 1 as:

$$V1=(1+(RF1/RIN1))(V_{IN}-V_{REF})+V_{REF}, \quad \text{EQ. 1}$$

where the reference voltage $V_{REF}$ is equal to the voltage that corresponds with the input signal having no amplitude, e.g., +2.5V for an input signal ranging from 0V to 5V.

Similarly, op amp 112 and resistors RF2 and RIN2 are connected together to form an inverting negative feedback circuit that outputs a second voltage V2 as described by equation 2 as:

$$V2=(-RF2/RIN2)(V_{IN}-V_{REF})+V_{REF}. \quad \text{EQ. 2}$$

Thus, when the voltage on the input signal $V_{IN}$ is equal to zero, the voltages V1 and V2 are defined by the reference voltage $V_{REF}$ multiplied times a resistive multiplier: (1+(RF1/RIN1)) for voltage V1 and (−RF2/RIN2) for voltage V2. The expressions (1+(RF1/RIN1)) and (−RF2/RIN2) are multipliers that add voltage gain to the input signal $V_{IN}$. For example, if resistors RF1 and RIN1 are both equal to 100Ω, then the expression (1+(RF1/RIN1)) will always multiply the expression (($V_{IN}-V_{REF}$)+$V_{REF}$) by two.

Similarly, if resistor RF2 is equal to 200Ω and resistor RIN2 is equal to 100Ω, then the expression (−RF2/RIN2) will always multiply the expression (($V_{IN}-V_{REF}$)+$V_{REF}$) by a negative two. As a result, the differential output voltage is two times the input voltage, e.g., a single-ended signal ranging from −2.5V to +2.5V is output differentially ranging from −5V to +5V.

An output version of the original input signal is formed as a difference between the first and second voltages, i.e., V1−V2. Thus, when the voltage on the input signal $V_{IN}$ is equal to zero, the difference V1−V2 is also equal to zero. When the input signal $V_{IN}$ makes a positive excursion, the voltage V1 output from op amp 110 increases while the voltage V2 output from op amp 112 decreases, thereby providing a larger differential voltage. On the other hand, when the input signal $V_{IN}$ makes a negative excursion, the voltage V1 decreases while the voltage V2 increases, thereby providing a smaller differential voltage.

One of the disadvantages of amplifier 100 is that, even though amplifier 100 receives a non-negative input signal, the lower supply rail VEE must be set to a negative voltage to accommodate the largest negative voltage output from op amps 110 and 112. For example, for an input signal ranging from zero-to-five volts, a +2.5V reference, and a resistor multiplier of two, the lower supply rail VEE must be set to −2.5V to accommodate the largest negative voltage of the first voltage V1 and the largest negative voltage of the second voltage V2. The requirement for a negative supply rail, however, adds additional cost and complexity.

Another disadvantage of amplifier 100 is that it is difficult to match the performance of op amps 110 and 112 such that the outputs of op amps 110 and 112 are clipped at the same time. Clipping occurs when the input voltage causes the output of an op amp to exceed the supply rail.

For example, assume that the upper supply rail VCC is set to +5V to accommodate the largest positive voltage output by the op amps, and the lower supply rail VEE is set to −5V to accommodate the largest negative voltage output by the op amps. In this case, an input voltage that would normally cause voltages V1 or V2 to exceed +5V is clipped because the voltages V1 and V2 cannot exceed the upper supply rail VCC of +5V. Similarly, an input voltage that would normally cause voltages V1 or V2 to fall below −5V is clipped because the voltages V1 and V2 cannot fall below the lower supply rail VEE of −5V.

Ideally, op amps 110 and 112 are matched such that an input voltage that just causes the first voltage V1 to be clipped also just causes the second voltage V2 to be clipped. In actual practice, however, variations in resistor values and other effects cause either the first voltage V1 to be clipped before the second voltage V2, or visa versa. The result of one voltage being clipped before the other causes the output voltage range of amplifier 100 to be reduced.

Another type of amplifier, known as a Class D, is very efficient at delivering power to a load. Class D amplifiers generate an amplified pulse train where the pulse widths of the pulses are modulated by the input signal. The pulse train is then fed into an inductor that averages out the pulse widths to recover an amplified version of the input signal.

One example of a Class D amplifier includes a comparator, and two series-connected switching devices which each have a gate connected to the output of the comparator. The comparator compares the voltage of the input signal with the voltage of a time varying reference signal, such as a sawtooth waveform.

In response to the comparison, the comparator outputs a pulse train. The pulses in the pulse train have pulse widths that are modulated by the results of the comparison. During each pulse period, when the signal is pulsed high, one of the switching devices is turned on while the other switching device is turned off, and visa versa when the signal is pulsed low. The action of the switching devices forms an amplified pulse train which has high and low values defined by the power supply rails. The amplified pulse train is then fed into an inductor that recovers an amplified version of the input signal.

The switching devices can be arranged so that there is very little voltage across a switching device at the time the switching device is carrying current, or so that there is a very high voltage across the switching device at the time the device is carrying very little current. Both of these are low power conditions.

Class D amplifiers, however, have a number of limitations that make them less than desirable for audio applications. One of the difficulties with Class D amplifiers is that the switching devices, which typically operate at very high frequencies, inject high frequency components into the signal.

These components then have to be filtered out before the signal is output to the load. Adding circuits to filter the signal, however, increases the cost and size of the amplifier. In addition, these high frequency components are also radiated from the inductor, thereby raising an electromagnetic interference (EMI) issue.

Another implementation, known as a Class G amplifier, is also very efficient at delivering power to the load. Class G amplifiers are connected to four power supplies: an upper supply V++ which is equal to the peak amplitude of the output signal, and a first mid supply V+ which is less than the upper supply. The remaining supplies include a lower supply V-- which is equal to the minimum amplitude of the output signal, and a second mid supply V- which is greater than the lower supply.

When the amplitude of the output signal ranges between the first mid supply V+ and the second mid supply V-, the Class G amplifier draws power from the first and second mid supplies V+ and V-. For signal excursions that go beyond these limits, the Class G amplifier switches and draws power from the upper and lower supplies V++ and V--.

Studies have indicated that music signals, which have a statistical nature, have a significant amplitude distribution at levels which are well below one-half the peak value. Thus, by using lesser supply voltages V+ and V- during the extensive periods of time that the amplifier output is equal to or less than one-half of the peak value, the amount of power consumed by the amplifier is reduced, thereby increasing the efficiency of the amplifier.

Another amplifier, known as Class H, is similar to the Class G amplifiers. Like Class G, Class H amplifiers are connected to four power supplies: an upper supply V++, a first mid supply V+, a lower supply V--, and a second mid supply V-. Also like the Class G amplifiers, when the amplitude of the output signal ranges between the first mid supply V+ and the second mid supply V-, the Class H amplifier draws power from the first and second mid supplies V+ and V-.

However, for signal excursions that go beyond these limits, the Class H amplifier modulates the upper and lower voltage supplies (V++) and (V--) to track the signal such that the voltage available to drive the output voltage remains a fixed number of volts greater than the output voltage.

FIG. 2 shows a schematic diagram that illustrates a conventional Class H bipolar-supply amplifier 200. As shown in FIG. 2, amplifier 200 includes an op amp 210 which has two signal inputs, a signal output, a positive supply input, and a negative supply input. In addition, amplifier 200 includes a first tracking circuit 212 that is connected to the output and the positive supply input of op amp 210, and a second tracking circuit 214 that is connected to the output and the negative supply input of op amp 210.

First tracking circuit 212, in turn, includes a tracking transistor 220, a diode D, and a first bias circuit 222. Transistor 220 has a gate connected to the first bias circuit 222, a drain connected to an upper power supply V++, and a source connected to a mid power supply V+ via diode D, and to the positive supply input of op amp 210.

In operation, first bias circuit 222 adds a predefined number of volts to the voltage on the output of op amp 210, and places the voltage on the gate of transistor 220. In addition, a voltage equal to one diode drop less than the mid power supply V+ is placed on the source of transistor 220 and on the positive supply input of op amp 210. When the voltage on the gate of transistor 220 exceeds the mid power supply V+, transistor 220 turns on and linearly increase the voltage on the positive supply input of op amp 210 as the voltage on the output increases.

For example, assume the case where the upper supply is equal to ten volts, the mid power supply is equal to five volts, and the bias voltage is equal to two volts. In this case, when the voltage on the output is equal to two volts, the voltage on the gate of transistor 220 is equal to four volts and the voltage on the source is equal to one diode drop less than five volts. When the voltage on the output is equal to three volts, the voltage on the gate of transistor 220 is equal to five volts and the voltage on the source is equal to one diode drop less than five volts.

When the voltage on the output is equal to four volts, the voltage on the gate of transistor 220 is equal to six volts and the voltage on the source is equal to one diode drop less than six volts. Thus, the voltage supplied to the positive supply input is at least two volts (less a diode drop) greater than the voltage on the output (until the upper supply is hit). In addition, second tracking circuit 214 operates in an identical, but opposite, fashion.

SUMMARY OF THE INVENTION

The present invention provides a differential audio-frequency power amplifier which does not require a negative supply voltage, and which eliminates the problem of lost information which occurs when one output is clipped before the other.

In accordance with the present invention, an amplifier includes a first operational amplifier (op amp) that has a negative input connected to a first intermediate node, a positive input connected to a second intermediate node, and an output connected to a first output node. The amplifier of the present invention also includes a second op amp that has a negative input connected to the second intermediate node, a positive input connected to a reference voltage, and an output connected to a second output node.

The amplifier also includes a first feedback resistor connected between the output and the negative input of the first op amp, and a second feedback resistor connected between the output and the negative input of the second op amp. Further, a first input resistor is connected between the negative input of the first op amp and the reference voltage, and a second input resistor is connected between the negative input of the second op amp and an input node.

In addition, the first and second op amps are each connected to an upper supply rail, and a lower supply rail. In the present invention, the lower supply rail can be a non-negative value.

A better understanding of the features and advantages of the present invention will be obtained by reference to the following detailed description and accompanying drawings which set forth an illustrative embodiment in which the principles of the invention are utilized.

DETAILED DESCRIPTION

Figure 1:
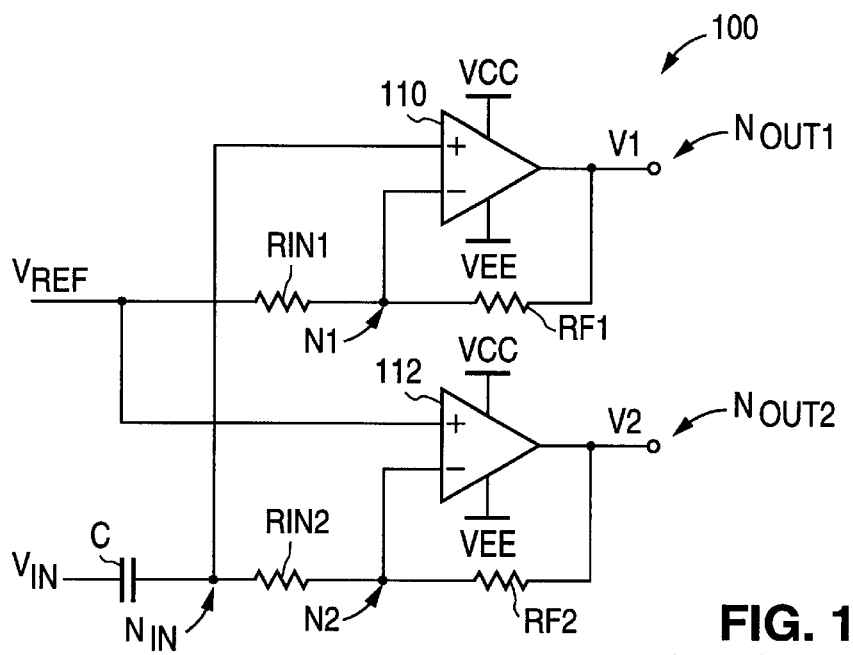
FIG. 1 is a schematic diagram illustrating a conventional bridged amplifier 100.
Figure 2:
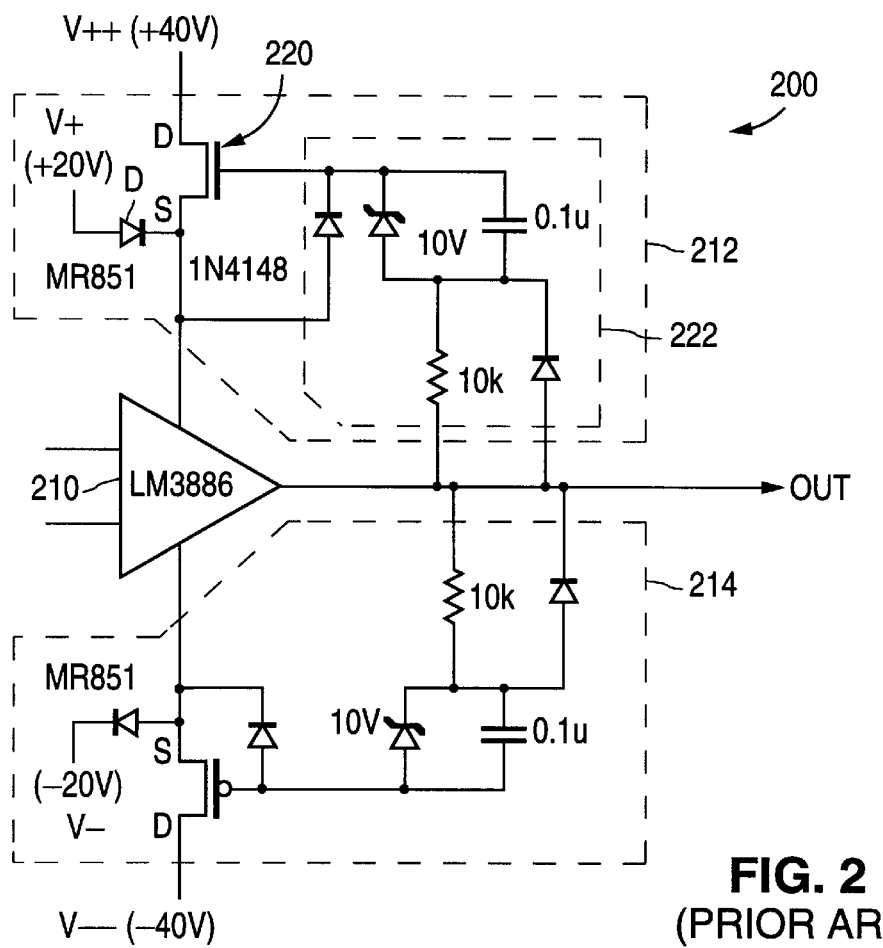
FIG. 2 is a schematic diagram illustrating a conventional Class H bipolar-supply amplifier 200.
Figure 3:
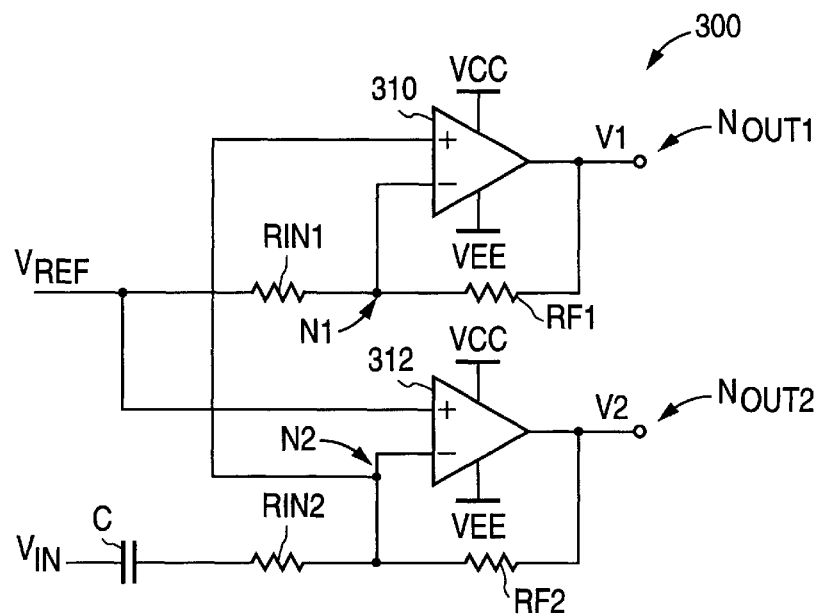
FIG. 3 is a schematic diagram illustrating a bridged amplifier 300 in accordance with the present invention.

FIG. 3 shows a schematic diagram that illustrates a bridged amplifier 300 in accordance with the present invention. As shown in FIG. 3, amplifier 300 includes a first operational amplifier (op amp) 310. First op amp 310, in turn, has a negative input connected to a first intermediate node N1, and a positive input connected to a second intermediate node N2. In addition, op amp 310 also has an output connected to a first output node $N_{OUT}$. Further, op amp 310 is connected to an upper supply rail VCC, and a lower supply rail VEE.

As additionally shown in FIG. 3, amplifier 300 also has a second operational amplifier (op amp) 312. Second op amp 312 has a negative input connected to the second intermediate node N2, and a positive input connected to a reference voltage $V_{REF}$. In addition, op amp 312 also has an output connected to a second output node $N_{OUT2}$. Further, op amp 312 is connected to the upper supply rail VCC, and the lower supply rail VEE.

Amplifier 300 additionally has a pair of feedback resistors RF1 and RF2, and a pair of input resistors RIN1 and RIN2. Feedback resistor RF1 is connected between the output and the negative input of op amp 310, while feedback resistor RF2 is connected between the output and the negative input of op amp 312.

Further, input resistor RIN1 is connected between the negative input of op amp 310 and the reference voltage $V_{REF}$, while input resistor RIN2 is connected between the negative input of op amp 312 and an input node $N_{IN}$. An input signal $V_{IN}$ can be directly applied to input node $N_{IN}$, or can be applied via a capacitor C as shown in FIG. 3.

In operation, op amp 310 and resistors RF1 and RIN1 are connected together to form a non-inverting negative feedback circuit that outputs a first voltage V1 as described by equations 3A–3B as:

$$V1 = V_{REFH}, \qquad \text{EQ. 3A}$$

when op amp 312 sets the second voltage V2 to a voltage that is equal to or greater than the voltage on the lower supply rail VEE while driving the voltage on the negative input of op amp 312 to be equal to the reference voltage $V_{REF}$ on the positive input, and $$V1 = ((RF1/RIN1)(V_{IN} - V_{REF})) + V2 \qquad \text{EQ. 3B}$$

when op amp 312 would have to pull down the second voltage V2 to a voltage less than the lower supply rail VEE to drive the voltage on the negative input of op amp 312 to be equal to the reference voltage $V_{REF}$ on the positive input. Equations 3A–3B are based on the assumption that RF1/RIN1=RF2/RIN2.

Similarly, op amp 312 and resistors RF2 and RIN2 are connected together to form an inverting negative feedback circuit that outputs a second voltage V2 as described by equations 4A–4B as:

$$V2 = (-RF2/RIN2)(V_{IN} - V_{REF}) + V_{REF}, \qquad \text{EQ. 4A}$$

when op amp 312 sets the second voltage V2 to a voltage that is equal to or greater than the voltage on the lower supply rail VEE while driving the voltage on the negative input of op amp 312 to be equal to the reference voltage $V_{REF}$ on the positive input, and $$V2 = VEE \qquad \text{EQ. 4B}$$

when op amp 312 would have to pull down the second voltage V2 to a voltage less than the lower supply rail VEE to drive the voltage on the negative input of op amp 312 to be equal to the reference voltage $V_{REF}$ on the positive input.

Figure 4A:
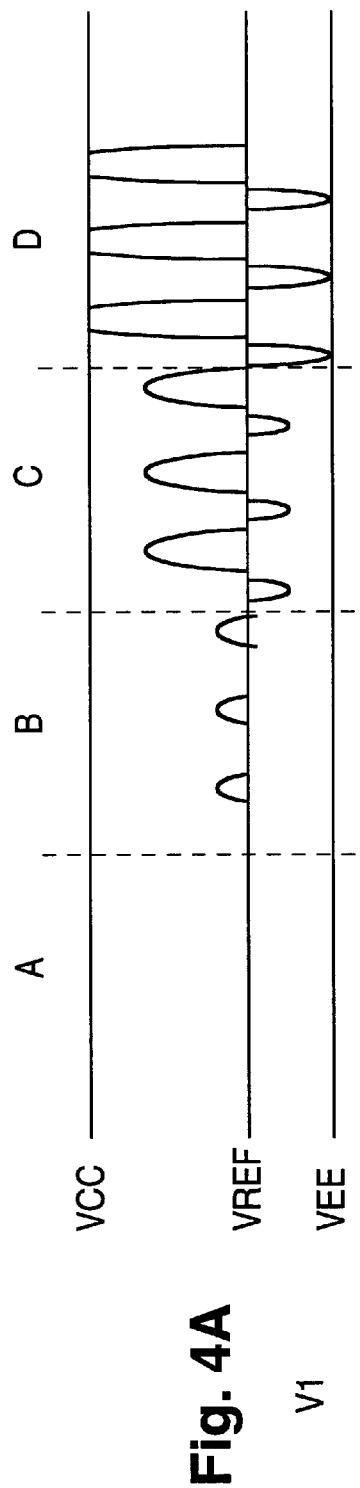
FIGS. 4A–4C are waveform diagrams further illustrating the operation of the present invention.
Figure 4B:
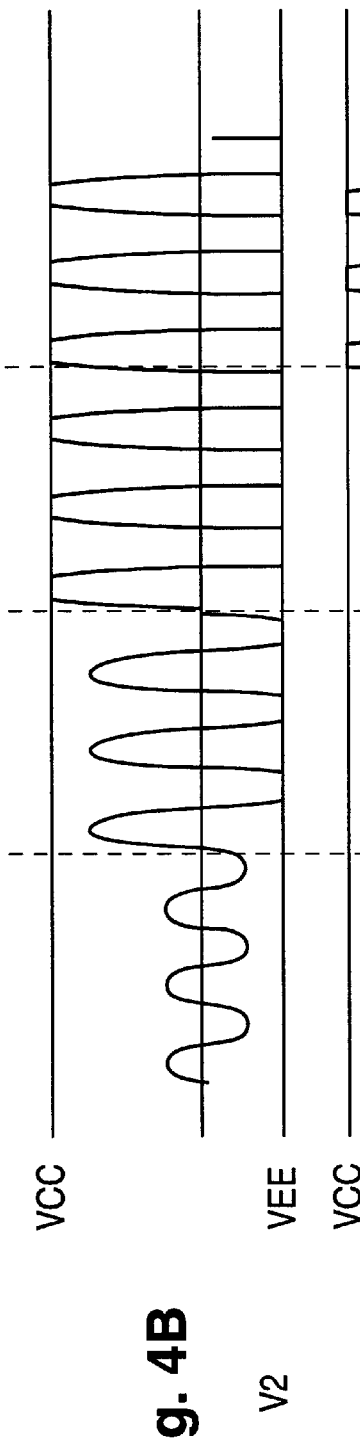
Figure 4C:
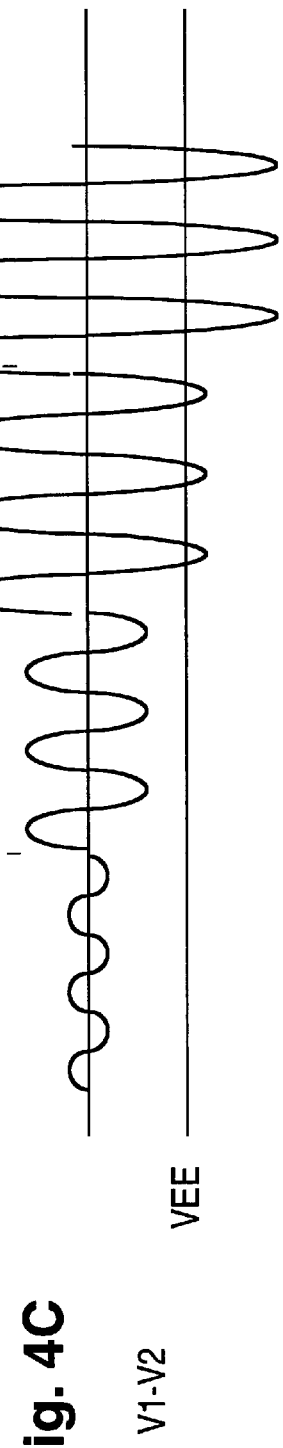

FIGS. 4A–4C show waveform diagrams that further illustrate the operation of the present invention. FIG. 4A shows the voltage V1, FIG. 4B shows the voltage V2, and FIG. 4C shows a difference voltage V1–V2. A (amplified) version of the original input signal is formed as the difference between the first and second voltages, i.e., V1–V2.

As shown in column A of FIGS. 4A–4C, the first voltage V1 is equal to the reference voltage $V_{REF}$ as long as the second voltage V2 is greater than or equal to the lower supply rail VEE. Thus, as long as op amp 312 can continue to move the voltage V2 to keep the voltage on the negative input equal to the reference voltage $V_{REF}$, the voltage V1 remains equal to the reference voltage $V_{REF}$.

However, as shown in column B of FIGS. 4A–4C, when the voltage V2 hits the lower rail VEE and is clipped, the voltage V1 responds in a manner that corresponds with the amount of the voltage V2 that was clipped. Thus, when op amp 312 can no longer keep the voltage on the negative input equal to the reference voltage $V_{REF}$, the voltage on the negative input of op amp 312 increases which, in turn, causes the voltage on the positive input of op amp 310 to increase.

When the voltage on the positive input increases, the voltage V1 increases and compensates for the amount of the voltage V2 that was clipped. In other words, the first voltage V1 rises by the same amount that the second voltage V2 would have had to fall below the lower supply rail VEE to drive the voltage on the negative input of op amp 312 to be equal to the reference voltage $V_{REF}$. Thus, as shown in column B of FIG. 4C, the difference signal V1–V2 shows that the difference between voltage V1 and the clipped voltage V2 form an amplified version of the input signal.

In addition, column C shows even when the voltage V2 is clipped against both rails, the voltage V1 compensates for the amount of the voltage V2 that was clipped. As shown in column D, when the voltage V1 reaches the upper supply rail, only then does the difference signal V1–V2 begin to clip.

One advantage of the present invention is that if the lower supply rail VEE is set to ground, amplifier 300 provides differential amplification without the need for a negative supply rail. As discussed above, if Class A/B amplifier 100 receives a non-negative input signal ranging from zero to five volts, amplifier 100 must provide a negative rail of –2.5V.

Amplifier 300, on the other hand, can respond to an input signal ranging from zero to five volts by providing a ground rail. By eliminating the need for a negative supply rail, the cost and complexity associated with providing a negative supply rail are saved.

Another advantage of the present invention is that the problem of one output getting clipped before the other output is eliminated. By setting the reference voltage $V_{REF}$ to a value which is less than one-half of the way to the upper supply rail VCC from ground, the difference voltage V1–V2 only begins to be clipped when the voltage V1 begins to be clipped. Unlike the example of Class A/B amplifier 100, the clipping of the voltage V2 is compensated for by the voltage V1 so that the full output range is utilized when the voltage V1 and the difference voltage V1–V2 are clipped.

Thus, rather than losing information when a signal is clipped as with Class A/B amplifier 100, in the present invention when the second voltage V2 is clipped, the information is directly shifted up to the first voltage V1. As a result, the second voltage V2 is not effectively clipped until the voltage on the input signal $V_{IN}$ is large enough to cause the first voltage V1 to be clipped. Thus, with respect to clipping, op amps 210 and 212 function as ideal op amps, and are therefore eliminate the output range reduction associated with clipped signals.

Figure 5:
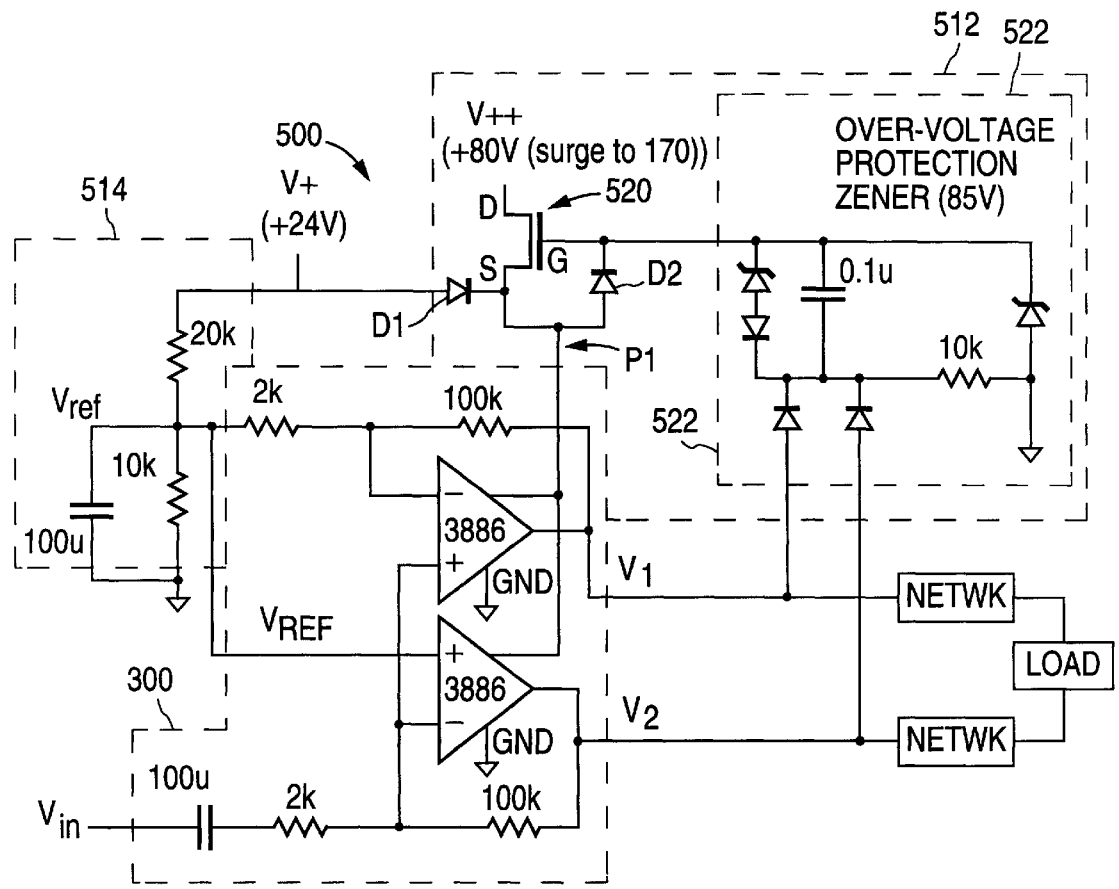
FIG. 5 is a schematic diagram illustrating a Class H amplifier 500 in accordance with the present invention.

FIG. 5 shows a schematic diagram that illustrates a Class H amplifier 500 in accordance with the present invention. As shown in FIG. 5, amplifier 500 includes amplifier 300 that has a signal input Vin, a pair of signal outputs V1 and V2, a positive supply input P1, and a negative supply input GND. In addition, amplifier 500 includes a tracking circuit 512 that is connected to the outputs V1 and V2 and the positive supply input P1 of op amp 300, and a reference voltage circuit 514 that provides the reference voltage $V_{REF}$.

Tracking circuit 512, in turn, includes a tracking transistor 520, a diode D1, a diode D2, and a bias circuit 522. Transistor 520 has a gate connected to the bias circuit 522, a drain connected to an upper power supply V++, and a source connected to a mid power supply V+ via diode D1, and to the positive supply input P1 of amplifier 300.

In operation, bias circuit 522 adds a predefined number of volts to the largest voltage on the outputs V1 and V2 of amplifier 300, and places the voltage on the gate of transistor 520. Positive supply input P1 of amplifier 300 is connected to the cathode of diode D1 as well as the source of transistor 520. As a result, a positive supply current is delivered to amplifier 300 through diode D1 from mid power supply V+ when the voltage at the gate of transistor 520 is insufficient to cause transistor 520 to conduct.

In this case, the voltage at the positive supply terminal of amplifier 520 is one bipolar diode drop below the mid power supply voltage V+. As the voltage at the gate of transistor 520 increases due to an increase in the voltage of outputs V1 or V2, transistor 520 begins to conduct current from the upper power supply V++, replacing the current supplied through diode D1.

Further increases in the voltage of outputs V1 or V2 increase the conduction of transistor 520 until the current through diode D1 is reduced to zero and diode D1 is commutated to the OFF state. For output voltages greater than this condition, all power supply current is supplied through transistor 520 from the upper power supply V++.

For example, assume that the upper supply is equal to ten volts, the mid power supply is equal to five volts, and a constant bias voltage of six volts is developed across the capacitor in bias circuit 522. The bias voltage results from the action of diode D1, diode D2, and the series combination of the zener diode and the conventional diode.

When the highest of the two amplifier output voltages is two volts, the voltage at the gate of transistor 520 is equal to 7.3 volts (two volts on output less a diode drop of 0.7V plus +6V across the capacitor). In addition, the voltage at the source of transistor 520 is equal to 4.3V (five volts on V+ less a diode drop of 0.7V across diode D1). Since the voltage at the gate of transistor 520 is 7.3V and the voltage at the source of transistor 520 is 4.3V, the gate to source voltage is 3V (7.3–4.3=3V). Thus, when the gate-to-source threshold voltage of a transistor suitable for use in 520 is greater than 3V, no current flows through transistor 520.

When the larger of the two voltages on outputs V1 and V2 is four volts, the voltage at the gate of transistor 520 is two volts higher, or 9.3 volts. If the gate-to-source threshold voltage is 3V, sufficient conduction occurs through transistor 520 to increase the voltage on the source of transistor 520 by two volts. This, in turn, results in commutation of diode D1 and maintenance of the voltage on the source of transistor 520 over and above the highest of the two amplifier input voltages.

One of the advantages of a Class H bridged amplifier in accordance with the present invention is that only two positive supply rails need to be provided rather than the four rails, two positive and two negative, that are conventionally used with Class H amplifiers. Thus, the Class H amplifier of the present invention "tracks" the voltage V1 once the voltage V1 and the bias voltage exceed the mid supply rail V+, thereby providing the efficiency of a Class H amplifier with two less rails.

It should be understood that various alternatives to the embodiment of the invention described herein may be employed in practicing the invention. Thus, it is intended that the following claims define the scope of the invention and that methods and structures within the scope of these claims and their equivalents be covered thereby.

What is claimed is:

1. An amplifier comprising:
   a first operational amplifier (op amp) having a negative input connected to a first intermediate node, a positive input directly connected to a second intermediate node, and an output connected to a first output node;
   a second op amp having a negative input directly connected to the second intermediate node, a positive input connected to a reference voltage, and an output connected to a second output node;
   a first feedback resistor connected between the output and the negative input of the first op amp; and
   a second feedback resistor connected between the output and the negative input of the second op amp;
   a first input resistor connected between the negative input of the first op amp and the reference voltage; and
   a second input resistor connected between the negative input of the second op amp and an input node.

2. The amplifier of claim 1 and further comprising a capacitor connected between the input node and the second input resistor.

3. The amplifier of claim 1 wherein the first and second op amps are each connected to an upper supply rail, and a lower supply rail.

4. The amplifier of claim 3 wherein lower supply rail is a non-negative value.

5. An amplifier comprising:
   a first operational amplifier (op amp) having a negative input connected to a first intermediate node, a positive input connected to a second intermediate node, and an output connected to a first output node, the first op amp being connected to an upper supply rail and a lower supply rail, the lower supply rail being a non-negative value;
   a second op amp having a negative input connected to the second intermediate node, a positive input connected to a reference voltage, and an output connected to a second output node, the second op amp being connected to an upper supply rail and a lower supply rail, the reference voltage being substantially equal to one-half the difference between the upper supply rail and the lower supply rail;
   a first feedback resistor connected between the output and the negative input of the first op amp;
   a second feedback resistor connected between the output and the negative input of the second op amp;
   a first input resistor connected between the negative input of the first op amp and the reference voltage; and
   a second input resistor connected between the negative input of the second op amp and an input node.

6. An amplifier comprising:
   a first operational amplifier (op amp) having a negative input connected to a first intermediate node, a positive input connected to a second intermediate node, and an output connected to a first output node, the first op amp being connected to an upper supply rail and a lower supply rail, the lower supply rail being a non-negative value;

a second op amp having a negative input connected to the second intermediate node, a positive input connected to a reference voltage, and an output connected to a second output node, the second op amp being connected to an upper supply rail and a lower supply rail, the reference voltage being equal to a value that is less than one-half the difference between the upper supply rail and the lower supply rail;

a first feedback resistor connected between the output and the negative input of the first op amp;

a second feedback resistor connected between the output and the negative input of the second op amp;

a first input resistor connected between the negative input of the first op amp and the reference voltage; and a second input resistor connected between the negative input of the second op amp and an input node.

7. An amplifier comprising:

a first operational amplifier (op amp) having a negative input connected to a first intermediate node, a positive input connected to a second intermediate node, and an output connected to a first output node, the first op amp being connected to an upper supply rail and a lower supply rail;

a second op amp having a negative input connected to the second intermediate node, a positive input connected to a reference voltage, and an output connected to a second output node, the second op amp being connected to an upper supply rail and a lower supply rail, the reference voltage being equal to a value that is less than one-half the difference between the upper supply rail and the lower supply rail;

a first feedback resistor connected between the output and the negative input of the first op amp;

a second feedback resistor connected between the output and the negative input of the second op amp;

a first input resistor connected between the negative input of the first op amp and the reference voltage; and a second input resistor connected between the negative input of the second op amp and an input node.

8. An amplifier comprising:

a first operational amplifier (op amp) having a negative input connected to a first intermediate node, a positive input connected to a second intermediate node, and an output connected to a first output node, the first op amp being connected to an upper supply rail and a lower supply rail, the first op amp outputting a first voltage;

a second op amp having a negative input connected to the second intermediate node, a positive input connected to a reference voltage, and an output connected to a second output node, the second op amp being connected to an upper supply rail and a lower supply rail, the second op amp outputting a second voltage, the first voltage being equal to the reference voltage when the second voltage is equal to or greater than the lower supply rail, and the voltages on the positive and negative inputs of the second op amp are the same;

a first feedback resistor connected between the output and the negative input of the first op amp;

a second feedback resistor connected between the output and the negative input of the second op amp;

a first input resistor connected between the negative input of the first op amp and the reference voltage; and a second input resistor connected between the negative input of the second op amp and an input node.

9. The amplifier of claim 8 wherein the second voltage is equal to a first multiplier times $((V_{IN}-V_{REF})+V_{REF})$ when the second voltage is equal to or greater than the voltage on the lower supply rail, and the voltages on the positive and negative inputs of the second op amp are the same.

10. The amplifier of claim 9 wherein the second voltage is equal to the lower supply rail when the second voltage is equal to the lower supply rail, and the voltage on the positive and negative inputs of the second op amp are different.

11. The amplifier of claim 10 wherein the first voltage is equal to a second multiplier multiplied times $(V_{IN}-V_{REF})$ plus the second voltage when the second voltage is equal to the lower supply rail, and the voltages on the positive and negative inputs of the second op amp are different.

12. An amplifier comprising;

an amplifying device including:

a first operational amplifier (op amp) having a negative input connected to a first intermediate node, a positive input connected to a second intermediate node, an output connected to a first output node, a first upper supply input, and a first lower supply input;

a second operational amplifier (op amp) having a negative input connected to the second intermediate node, a positive input connected to a reference voltage, an output connected to a second output node, a second upper supply input, and a second lower supply input;

a first feedback resistor connected between the output and the negative input of the first op amp;

a second feedback resistor connected between the output and the negative input of the second op amp;

a first input resistor connected between the negative input of the first op amp and the reference voltage;

a second input resistor connected between the negative input of the second op amp and an input node, and a tracking circuit connected to the outputs of the first and second op amps, and the first and second upper supply inputs of the first and second op amps.

13. The amplifier of claim 12 wherein the tracking circuit includes:

a tracking transistor having a gate, a source connected to the first and second upper supply inputs of the first and second op amps, and a drain connected to a first supply;

a first diode connected to a second supply and the source of the tracking transistor;

second diode connected between the source and drain of the tracking transistor; and a bias circuit connected to the outputs of the first and second op amps, and the gate of the tracking transistor.

14. The amplifier of claim 12 and further comprising a capacitor connected between the input node and the second input resistor.

15. The amplifier of claim 12 wherein lower supply rail is a non-negative value.

16. The amplifier of claim 12 wherein the reference voltage is substantially equal to one-half the difference between the upper supply rail and the lower supply rail.

17. The amplifier of claim 12 wherein the reference voltage is equal to a value that is less than one-half the difference between the upper supply rail and the lower supply rail.

18. An amplifier comprising:

a first operational amplifier (op amp) having a negative input, a positive input, and an output;

a second op amp having a negative input directly connected to the positive input of the first op amp, a positive input, and an output;

a first feedback resistor connected between the output and the negative input of the first op amp; and a second feedback resistor connected between the output and the negative input of the second op amp.

19. The amplifier of claim 18 and further comprising:

a first input resistor connected between the negative input of the first op amp and a reference node; and a second input resistor connected between the negative input of the second op amp and an input node.

20. The amplifier of claim 19 and further comprising a capacitor connected between the second input resistor and the input node.

21. The amplifier of claim 20
wherein the first and second op amps are each connected to an upper supply node and a lower supply node, the upper supply node having an upper voltage and the lower supply node having a lower voltage, and
wherein the first op amp outputs a first voltage and the second op amp outputs a second voltage, the first voltage being equal to a reference voltage on the reference node when the second voltage is equal to or greater than the lower voltage on the lower supply node, and a voltage on the positive input of the second op amp is equal to a voltage on the negative input of the second op amp.

22. The amplifier of claim 21
wherein a third voltage is equal to a first resistive multiplier multiplied times a fourth voltage,
wherein the fourth voltage is equal to an input voltage on the input node minus the reference voltage, and
wherein the second voltage is equal to the third voltage plus the reference voltage.

23. The amplifier of claim 22 wherein the second voltage is equal to the lower voltage on the lower supply node when the second voltage is equal to the lower voltage on the lower supply node, and a voltage on the positive input of the second op amp is different from a voltage on the negative input of the second op amp.

24. The amplifier of claim 23 wherein the first voltage is equal to a second resistive multiplier multiplied times a fifth voltage, the fifth voltage being equal to the input voltage minus the reference voltage.

25. An amplifier comprising:
a first operational amplifier (op amp) having a negative input, a positive input, and an output;
a second op amp having a negative input, a positive input connected to a reference node, and an output;
a first feedback resistor connected between the output and the negative input of the first op amp;
a second feedback resistor connected between the output and the negative input of the second op amp; and
a reference resistor directly connected to the negative input of the first op amp and the reference node.

26. The amplifier of claim 25 and further comprising an input resistor connected between the negative input of the second op amp and an input node.

27. The amplifier of claim 26 wherein the positive input of the first op amp is connected to the negative input of the second op amp.

28. An amplifier comprising:
an input node having an input voltage, an amplitude of the input voltage varying over time in response to an input signal;
a control node coupled to the input node, the control node having a control voltage;

a first resistor;
a first operational amplifier (op amp) having a positive input coupled to the control node, a negative input coupled to the first resistor, and a first output coupled to the first resistor, the first output having a first voltage, the first op amp outputting the first voltage with a substantially constant amplitude when the control voltage is equal to a control value, and varying an amplitude of the first voltage in response to the control voltage varying from the control value;

a second resistor;

a second op amp having a positive input, a negative input coupled to the control node and the second resistor, and a second output coupled to the second resistor, the second output having a second voltage, the second op amp varying an amplitude of the second voltage within a range bounded by a lower voltage and an upper voltage in response to variations in the input voltage to drive the control voltage to be equal to the control value, outputting the lower voltage when a third voltage less than the lower voltage is required to drive the control voltage to be equal to the control value, and outputting the upper voltage when a fourth voltage greater than upper voltage is required to drive the control voltage to be equal to the control value, the control voltage varying from the control value when the third voltage is required to drive the control voltage to be equal to the control value, the control voltage varying from the control value when the fourth voltage is required to drive the control voltage to be equal to the control value.

29. The amplifier of claim 28 wherein the positive input of the second op amp is coupled to a reference node to receive a reference voltage.

30. The amplifier of claim 29 wherein the positive input of the second op amp is coupled to the reference node via a direct connection.

31. The amplifier of claim 30 and further comprising a reference resistor that is coupled to the negative input of the first op amp and the reference node.

32. The amplifier of claim 31 and further comprising an input resistor coupled to the negative input of the second op amp and the input node.

33. The amplifier of claim 32 and further comprising a capacitor coupled between the input node and the input resistor.

34. The amplifier of claim 28 wherein the positive input of the first op amp is coupled to the control node via a direct connection.

35. The amplifier of claim 34 wherein the negative input of the second op amp is coupled to the control node via a direct connection.

36. The amplifier of claim 28 wherein an amplified output signal is obtained by subtracting the second voltage from the first voltage, the amplified output signal having a non-clipped waveform when the third voltage is required as long as the amplitude of the first voltage is equal to or greater than the lower voltage.

37. The amplifier of claim 28 wherein the amplified output signal has a non-clipped waveform when the third voltage and the fourth voltage are required as long as the amplitude of the first voltage is equal to or greater than the lower voltage, and equal to or less than the upper voltage.

* * * * *

UNITED STATES PATENT AND TRADEMARK OFFICE
CERTIFICATE OF CORRECTION

PATENT NO. : 6,304,138 B1
DATED : October 16, 2001
INVENTOR(S) : Nicky M. Johnson It is certified that error appears in the above-identified patent and that said Letters Patent is hereby corrected as shown below:

<u>Title page,</u>
Item [54], delete "AMPLIFIED" and replace with -- AMPLIFIER --.

<u>Column 12,</u>
Line 15, after "comprising" delete ";" and replace with -- : --.
Line 46, before "second" insert -- a --.

Signed and Sealed this

Twenty-sixth Day of March, 2002

Attest:

JAMES E. ROGAN
*Director of the United States Patent and Trademark Office*

*Attesting Officer*